United States Patent
Lee et al.

(10) Patent No.: US 9,084,355 B2
(45) Date of Patent: Jul. 14, 2015

(54) FLEXIBLE PRINTED CIRCUIT BOARD ASSEMBLY AND FLAT PANEL DISPLAY APPARATUS USING THE SAME

(71) Applicant: Samsung Display Co., Ltd., Yongin, Gyeonggi-Do (KR)

(72) Inventors: Sang-Yun Lee, Yongin (KR); Oh-Seob Kwon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 213 days.

(21) Appl. No.: 13/785,961

(22) Filed: Mar. 5, 2013

(65) Prior Publication Data

US 2014/0055972 A1 Feb. 27, 2014

(30) Foreign Application Priority Data

Aug. 27, 2012 (KR) .................. 10-2012-0093892

(51) Int. Cl.
*H05K 1/02* (2006.01)
*H05K 1/11* (2006.01)
*H05K 1/09* (2006.01)

(52) U.S. Cl.
CPC .............. *H05K 1/0296* (2013.01); *H05K 1/118* (2013.01); *H05K 2201/0367* (2013.01); *H05K 2201/098* (2013.01); *H05K 2201/09827* (2013.01); *H05K 2201/10128* (2013.01)

(58) Field of Classification Search
CPC ....................................................... H05K 1/09
USPC ........... 174/257, 254; 361/803; 333/116, 238; 156/47
See application file for complete search history.

(56) References Cited

U.S. PATENT DOCUMENTS

| | | | |
|---|---|---|---|
| 3,801,388 A * | 4/1974 | Akiyama et al. ................ 216/20 |
| 4,404,059 A * | 9/1983 | Livshits et al. ................. 216/17 |
| 5,116,459 A * | 5/1992 | Kordus et al. .................. 216/20 |
| 6,013,573 A * | 1/2000 | Yagi .............................. 438/619 |
| 6,016,087 A * | 1/2000 | Sasaki et al. ................... 333/116 |
| 6,111,204 A * | 8/2000 | Goenka ......................... 174/257 |
| 6,403,893 B2 * | 6/2002 | Achari et al. .................. 174/255 |
| 6,624,519 B1 * | 9/2003 | Farrar ............................ 257/771 |
| 6,852,932 B2 * | 2/2005 | Achari et al. .................. 174/262 |
| 7,633,590 B2 | 12/2009 | Ueda et al. |
| 2002/0086243 A1 * | 7/2002 | Li et al. ......................... 430/313 |
| 2002/0175407 A1 | 11/2002 | Morimoto et al. |
| 2009/0044968 A1 * | 2/2009 | Pai et al. ....................... 174/254 |
| 2009/0227172 A1 * | 9/2009 | Kim .............................. 445/49 |
| 2011/0247868 A1 * | 10/2011 | Chia ............................. 174/261 |
| 2013/0045636 A1 * | 2/2013 | Endo et al. .................... 439/629 |

FOREIGN PATENT DOCUMENTS

| | | | |
|---|---|---|---|
| JP | 2010-129670 | 6/2010 | |
| KR | 10-2002-0030122 | 4/2002 | |
| KR | 10-2008-0025384 | 3/2008 | |
| KR | 2012066542 | * 6/2012 | .............. H01I 51/50 |

* cited by examiner

*Primary Examiner* — Timothy Thompson
*Assistant Examiner* — Michael F McAllister
(74) *Attorney, Agent, or Firm* — Robert E. Bushnell, Esq.

(57) ABSTRACT

A flexible printed circuit board assembly includes a circuit board main body and a connection terminal provided at one side of the circuit board main body. The connection terminal has a shape in which a width of a portion farther from the circuit board main body is greater than a width of a portion closer to the circuit board main body.

6 Claims, 4 Drawing Sheets

FLEXIBLE PRINTED CIRCUIT BOARD ASSEMBLY AND FLAT PANEL DISPLAY APPARATUS USING THE SAME

CLAIM OF PRIORITY

This application makes reference to, incorporates the same herein, and claims all benefits accruing under 35 U.S.C. §119 from an application earlier filed in the Korean Intellectual Property Office on 27 Aug. 2012 and there duly assigned Serial No. 10-2012-0093892.

BACKGROUND OF THE INVENTION

1. Field of the Invention

An embodiment of the present invention relates to a flexible printed circuit board (FPCB) assembly used for a flat panel display apparatus, and more particularly, to a FPCB assembly in which the structure of a connection terminal is improved, and a flat panel display apparatus using the FPCB assembly.

2. Description of the Related Art

Flat panel display apparatuses such as organic light emitting diodes or liquid crystal display devices include numerous component parts that are operated through exchange of signals with a controller to produce an image. The component parts are connected to the controller via a flexible printed circuit board (FPCB). In general, a terminal connected to each component part (hereinafter, referred to as the cell terminal) is provided at one side of a flat panel display apparatus. As a terminal of the FPCB (hereinafter, referred to as the connection terminal) is connected to the cell terminal, the controller and the component parts may be electrically connected to each other via the FPCB.

The cell terminal and the connection terminal may however be inaccurately connected to each other due to misalignment therebetween. When the connection terminals are abraded, a short circuit may occur as the cell terminals are electrically connected via the connection terminal. Accordingly, a structure for preventing such danger is needed. A case of a short circuit occurring due to an abraded contemporary connection terminal will be described below in comparison with a structure constructed with the principle of an embodiment of the present invention.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention provides a flexible printed circuit board (FPCB) assembly having an improved connection terminal structure guaranteeing stable connection to a cell terminal, and a flat panel display apparatus using the FPCB assembly.

In accordance with an aspect of the present invention, a flexible printed circuit board assembly includes a circuit board main body, and a connection terminal provided at one side of the circuit board main body. The connection terminal has a shape in which a width of a portion farther from the circuit board main body is greater than a width of a portion closer to the circuit board main body.

A width of the connection terminal may gradually increase as the connection terminal is away from the circuit board main body.

A sectional shape of the connection terminal may be trapezoidal.

The connection terminal may be provided in plural numbers, and an interval between the connection terminals may be wider than a width of a counterpart terminal to be connected to each connection terminal.

In accordance with another aspect of the present invention, a flat panel display apparatus includes a cell terminal provided on a substrate for connection to a component part, and a flexible printed circuit board assembly connected to the cell terminal. The flexible printed circuit board includes a circuit board main body and a connection terminal provided at one side of the circuit board main body, and the connection terminal has a shape in which a width of a portion farther from the circuit board main body is greater than a width of a portion closer to the circuit board main body.

A width of the connection terminal may gradually increase as the connection terminal is away from the circuit board main body.

A sectional shape of the connection terminal may be trapezoidal.

The connection terminal may be provided in plural numbers, and an interval between the connection terminals may be wider than a width of a counterpart terminal to be connected to each connection terminal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
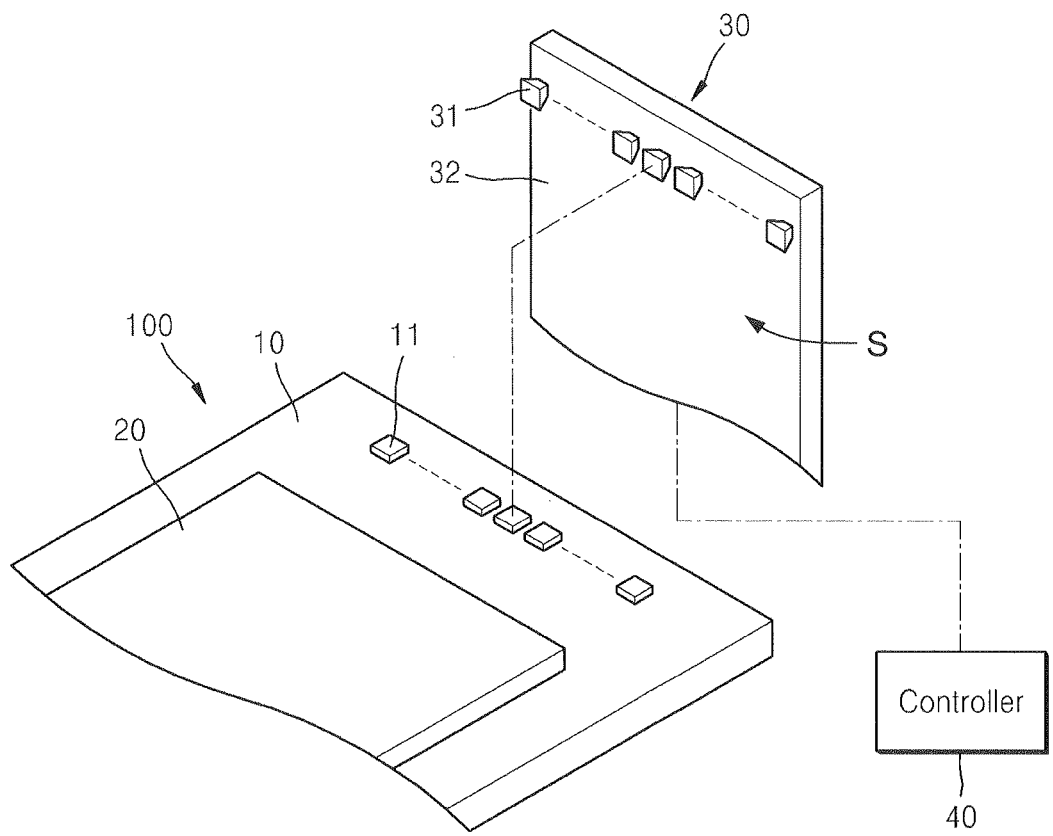
FIG. 1 is an exploded oblique view schematically illustrating a flat panel display apparatus using a FPCB assembly constructed with the principle of an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
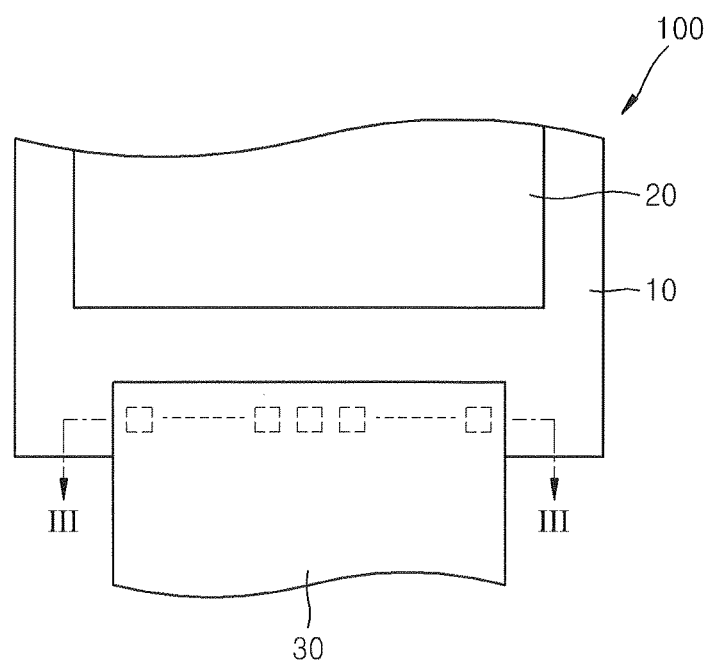
FIG. 2 is a plan view schematically illustrating a coupling state of FIG. 1.
Figure 3A:
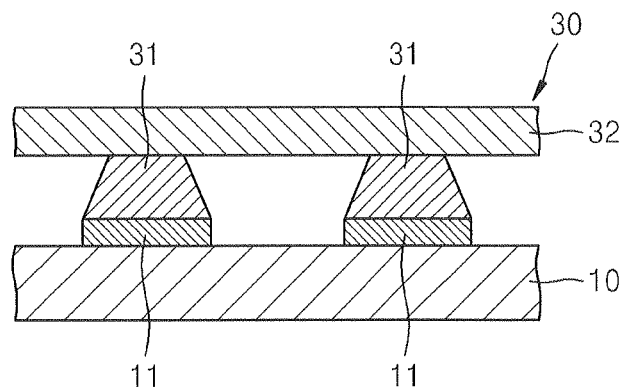
FIG. 3A is a cross-sectional view taken along line III-III of FIG. 2, showing a normal connection state.
Figure 3B:
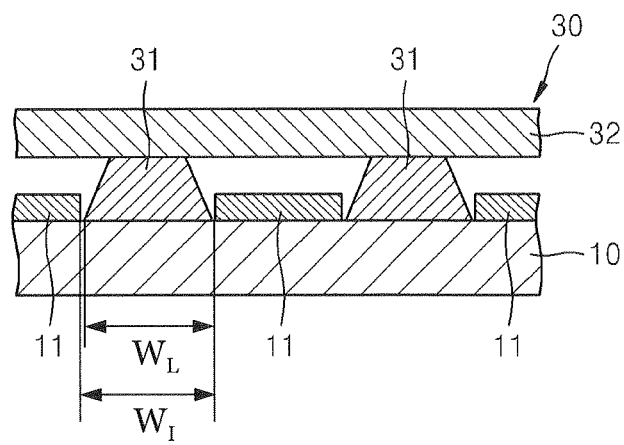
FIG. 3B is a cross-sectional view taken along line III-III of FIG. 2, showing an abnormal connection state due to misalignment.

FIG. 1 is an exploded oblique view schematically illustrating a flat panel display apparatus 100 uses a flexible printed circuit board (FPCB) assembly 30 constructed with the principle of an embodiment of the present invention. FIG. 2 is a plan view schematically illustrating a coupling state of FIG. 1. FIGS. 3A and 3B are cross-sectional views taken along line III-III of FIG. 2, respectively showing a normal connection state and an abnormal connection state due to misalignment.

In reference to FIGS. 1, 2, 3A, and 3B, the flat panel display apparatus 100 constructed with the principle of the present embodiment includes a substrate 10, a display unit 20, and a plurality of cell terminals 11 connected to the display unit 20. Numerous component parts such as a thin film transistor or a capacitor operated to produce an image are provided on the display unit 20. The component parts are connected to a controller 40 via the cell terminals 11 and the FPCB assembly 30 and are controlled by the controller 40.

The FPCB assembly 30 includes a circuit board main body 32 and a plurality of connection terminals 31 provided at one side S of the circuit board main body 32. The connection terminals 31 are connected to the cell terminals 11 in a one-to-one relationship.

Each of the connection terminals 31 has a trapezoidal shape in which the width of the connection terminal 31 increases as the connection terminal 31 extends away from the circuit board main body 32, as illustrated in FIGS. 3A and 3B. In other words, each connection terminal 31 has an extended shape in which the width of a portion farther from the circuit board main body 32 is relatively greater than that of a portion closer to the circuit board main body 32. Each of the connection terminals 31 has the above extended shape and thus a short circuit may be prevented even when the connection terminals 31 and the cell terminals 11 are connected in a misalignment state.

The principle of preventing a short circuit by using the connection terminals 31 having the extended shape will be described in comparison with a comparative example.

FIG. 3B illustrates a case in which the connection terminals 31 of the FPCB assembly 30 are connected to the cell terminals 11 by being misaligned therebetween. In this case, basically, since the largest width $W_L$ of each connection terminal 31 is smaller than the interval $W_I$ between the cell terminals 11, a short circuit that one of the connection terminals 31 simultaneously contacts the neighboring cell terminals 11 does not occur. In one embodiment, the interval between the two neighboring connection terminals 31 is wider than a width of a cell terminal 11 which is desired to be connected to a corresponding connection terminal 31.

Figure 4A:
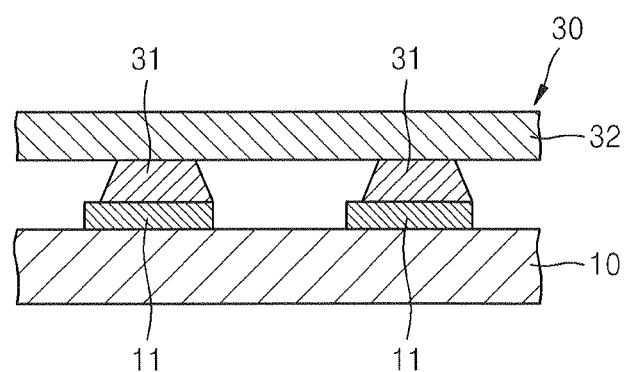
FIG. 4A illustrates a state in which the connection terminal is abraded in FIG. 3A.
Figure 4B:
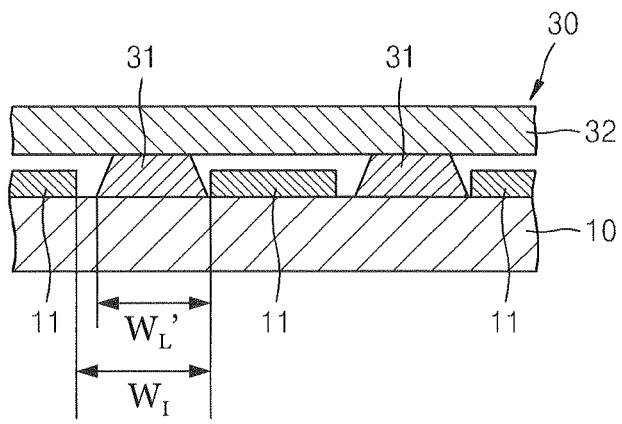
FIG. 4B illustrates a state in which the connection terminal is abraded in FIG. 3B.

In accordance with the principle of the present embodiment, no problem occurs when the connection terminals 31 that are abraded are connected to the cell terminals 11. In other words, as illustrated in FIG. 4A, when the connection terminals 31 that are abraded are accurately connected to the cell terminals 11, no problem occurs. Also, as illustrated in FIG. 4B, when the connection terminals 31 that are abraded are connected to the cell terminals 11 by being misaligned with each other, a short circuit of one of the connection terminals 31 simultaneously contacting the neighboring cell terminals 11 does not occur because the largest width $W_L'$ of each of the connection terminals 31 that are abraded is narrower than the largest width $W_L$ of each of the connection terminals 31 that are not abraded.

However, the situation changes in a case of connection terminals 31' of FIGS. 5A through 6B, which illustrate a comparative example. In general, a contemporary connection terminal has a shape as shown in FIGS. 5A through 6B. As illustrated in FIGS. 5A through 6B, the width of each of the connection terminals 31' decreases as the connection terminal 31' is away from the circuit board main body 32 of the FPCB assembly 30. In other words, the connection terminals 31' have the reversed shape to the connection terminals 31 of the present invention.

Figure 5A:
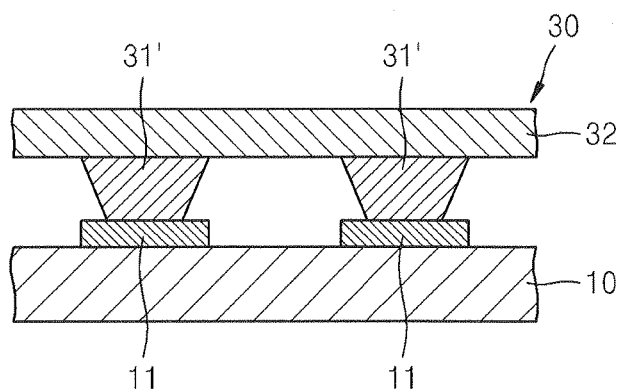
FIG. 5A illustrates, as a comparative example, a normal connection state when a connection terminal has a reverse shape to that of the embodiment of the present invention.
Figure 5B:
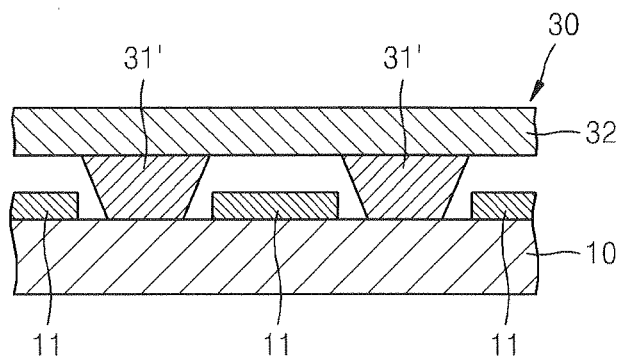
FIG. 5B illustrates an abnormal connection state due to misalignment of the connection terminal of FIG. 5A.
Figure 6A:
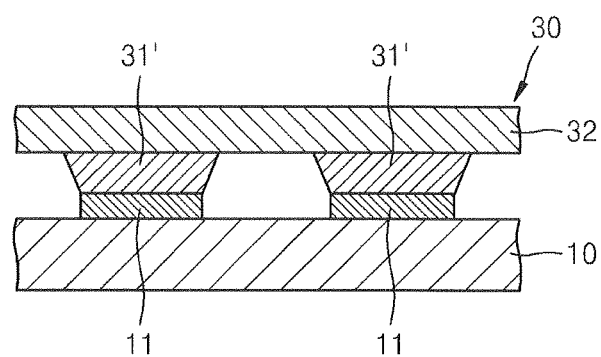
FIG. 6A illustrates a state in which the connection terminal is abraded in FIG. 5A.

When the contemporary connection terminals 31' and the cell terminals 11 are accurately aligned with each other as illustrated in FIG. 5A, no problem occurs. Also, as illustrated in FIG. 6A, even when the connection terminals 31' are abraded, if the connection terminals 31' and the cell terminals 11 are accurately aligned with each other, a short circuit does not occur. Furthermore, as illustrated in FIG. 5B, when misalignment occurs, a short circuit hardly occurs because the width of each of the connection terminals 31' that are normal and not abraded is narrower than the interval between the cell terminals 11.

Figure 6B:
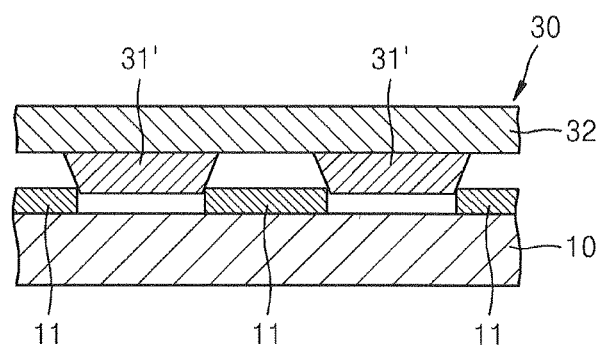
FIG. 6B illustrates a state in which the connection terminal is abraded in FIG. 5B.

A problem however occurs when the connection terminals 31' that are abraded are connected between the cell terminals 11 by being misaligned as illustrated in FIG. 6B. In the comparative example, the smallest width of each of the connection terminals 31' that are abraded is wider than the smallest width of each of the connection terminal 31' that are not abraded. In other words, since the connection terminals 31' have the shape in which the width thereof increases as it is closer to the circuit board main body 32, as abrasion occurs, the width of a portion contacting the cell terminals 11 further increases. Thus, as abrasion continues, the connection terminals 31' initially designed to be narrower than the interval between the neighboring cell terminals 11 have a width wider than the interval between the neighboring cell terminals 11. When a connection is made in the state, one of the connection terminals 31' simultaneously contacts the neighboring cell terminals 11 as illustrated in FIG. 6B, and thus a short circuit occurs. Then, other component parts of the display unit 20 provided on the substrate 10 are damaged by the short circuit and thus defective products may be manufactured.

In the FPCB assembly 30 constructed with the present embodiment, however, even when the connection terminals 31 are abraded, the simultaneous contact of the neighboring cell terminals 11 does not occur so that manufacturing of a defect product due to the short circuit may be fundamentally prevented.

Thus, stable connection without risk of a short circuit may be guaranteed regardless of whether the connection terminals 31 are abraded. The flat panel display apparatus 100 using the FPCB assembly 30 may be evaluated as a product with a lower defect rate.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A flexible printed circuit board assembly, comprising:
   a circuit board main body; and
   a connection terminal provided at one side of the circuit board main body, the connection terminal having a shape in which a width of a portion farther from the circuit board main body is greater than a width of a portion closer to the circuit board main body, wherein the connection terminal is provided in a plural number, and an interval between the connection terminals is wider than a width of a counterpart terminal to be connected to each connection terminal.

2. The flexible printed circuit board assembly of claim 1, wherein a width of the connection terminal gradually increases as the connection terminal extends away from the circuit board main body.

3. The flexible printed circuit board assembly of claim 2, wherein a cross-sectional shape of the connection terminal is trapezoidal.

4. A flat panel display apparatus, comprising:
a plurality of cell terminals provided on a substrate for connection to a component part; and
a flexible printed circuit board assembly connected to the cell terminals, the flexible printed circuit board comprising a circuit board main body and a plurality of connection terminals provided at one side of the circuit board main body, and the connection terminals having a shape in which a width of a portion farther from the circuit board main body is greater than a width of a portion closer to the circuit board main body, each connection terminal connected to each cell terminal, wherein an interval between the connection terminals is wider than a width of the each cell terminal connected to the corresponding connection terminal.

5. The flat panel display apparatus of claim 4, wherein a width of the connection terminal gradually increases as the connection terminal extends away from the circuit board main body.

6. The flat panel display apparatus of claim 5, wherein a cross-sectional shape of the connection terminal is trapezoidal.

* * * * *